United States Patent [19]

Tobita et al.

[11] 4,398,100

[45] Aug. 9, 1983

[54] BOOSTER CIRCUIT

[75] Inventors: Youichi Tobita, Itami, Japan; Hiroshi Nishizawa, deceased, late of Osaka, Japan, by Kazuo Nishizawa, Emiko Nishizawa, heirs

[73] Assignee: Mitsubishi Denki Kabushiki Kaisha, Tokyo, Japan

[21] Appl. No.: 196,980

[22] Filed: Oct. 14, 1980

[30] Foreign Application Priority Data

Mar. 14, 1980 [JP] Japan ................................ 55-32892

[51] Int. Cl.³ .......................................... H03K 5/01
[52] U.S. Cl. .................................. 307/264; 307/482; 307/578
[58] Field of Search ............... 307/264, 304, 482, 578, 307/296 A

[56] References Cited

U.S. PATENT DOCUMENTS

| | | | |
|---|---|---|---|
| 3,805,059 | 4/1964 | Lee et al. | 307/304 |
| 3,986,044 | 10/1976 | Madland et al. | 307/482 |
| 4,071,783 | 1/1978 | Knepper | 307/482 |
| 4,129,794 | 12/1978 | Dickson et al. | 307/482 |
| 4,330,719 | 5/1982 | Nagami | 307/578 |

*Primary Examiner*—John Zazworsky
*Attorney, Agent, or Firm*—Sughrue, Mion, Zinn, Macpeak & Seas

[57] ABSTRACT

A booster circuit in which a signal to be boosted and a boost capacitor are electrically separated during driving periods and are electrically coupled during boosting periods so that the capacitive load which the signal to be boosted must drive is significantly reduced. The boost capacitor is preferably charged to a predetermined voltage level prior to the boosting periods. The coupling means used is preferably an insulated gate FET transistor the gate voltage of which is controlled to be not lower than a power source voltage level before the boosting periods of time.

10 Claims, 27 Drawing Figures

FIG. 11
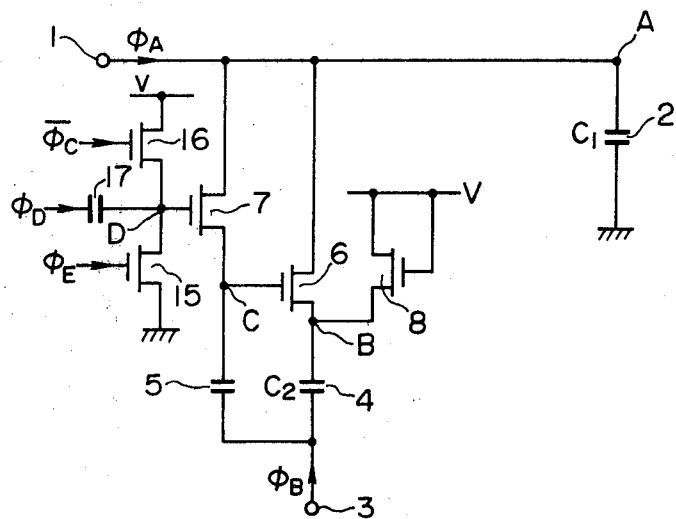
FIG. 12A
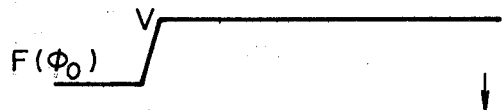
FIG. 12B
FIG. 12C
FIG. 12D
FIG. 12E
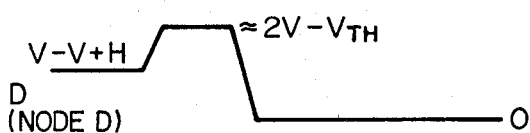
FIG. 12F

BOOSTER CIRCUIT

BACKGROUND OF THE INVENTION

The present invention relates to booster circuits implemented with MOS (metal oxide semiconductor) type integrated circuits.

Heretofore, a variety of such circuits have been proposed. An example of a conventional booster circuit is shown in FIG. 1. In FIG. 1, reference numeral 1 designates an input terminal to which a signal $\phi_A$ to be boosted is applied, reference numeral 2 a load capacitor for the signal $\phi_A$, 3 an input terminal to which a boost signal $\phi_B$ is applied, and 4 a boost capacitor.

In the circuit shown in FIG. 1, a voltage $\phi_A$ which is to be boosted in response to the boost signal $\phi_B$ as shown in FIG. 2B is represented by $$\frac{C_2}{C_1 + C_2} V$$

as shown in FIG. 2A where $C_1$ is the capacitance of the load capacitor 2, $C_2$ is the capacitance of the boost capacitor 4 and V is the voltage of an external voltage source. Accordingly, assuming that the voltage V is set externally, the boost range of the voltage is defined by the capacitance of the boost capacitor 4. That is, as is clear from the above expression, in the case where the load capacitor $C_1$ is relatively large, the capacitance value of the boost capacitor $C_2$ must also accordingly be large. Due to this fact, if it is desired that the large load capacitor 2 be driven by the signal $\phi_A$ at a high rate, it is necessary to provide the signal $\phi_A$ with a high driving ability for driving the boost capacitor 4. To provide a high driving ability requires a great deal of chip area for a driving circuit on an integrated circuit chip and results in a high power consumption for the driving circuit.

SUMMARY OF THE INVENTION

In view of the above, it is a primary object of the present invention to eliminate the above-described drawbacks accompanying the conventional booster circuits as implemented with an integrated circuit.

This, as well as other objects, is accomplished by the provision of a booster circuit according to the invention in which a signal to be boosted and a boost capacitor are electrically separated during driving periods and are electrically coupled during boosting periods. As a result, it is possible to decrease the capacitive load which the signal to be boosted must drive.

In accordance with a preferred embodiment, a booster circuit is provided including a load capacitor coupled to be driven by a signal to be boosted, a boost capacitor to which a boosting signal is applied, and means for coupling the signal to be boosted to the boost capacitor only during the boosting periods of time for the signal to be boosted. Means may be provided for charging the boost capacitor to a predetermined voltage level before the boosting periods. The coupling means preferably is an FET transistor, specifically an insulated gate FET transistor the gate voltage of which is controlled to be not lower than a power source voltage level before the boosting periods. The FET transistor may have a first signal electrode coupled to receive the signal to be boosted and a second signal electrode coupled to the boost capacitor. As used herein, the term signal electrode can mean either the source or drain of the FET transistor depending upon the polarities of the voltages used.

BRIEF DESCRIPTION OF THE DRAWINGS

In the accompanying drawings:

FIGS. 7, 9 and 11 are circuit diagrams showing still further preferred embodiments of a booster circuit of the invention; and FIGS. 8A–8C, 10A–10C and 12A–12F are explanatory diagrams showing signal waveforms for describing the operation of the corresponding circuits shown in FIGS. 7, 9 and 11, respectively.

DESCRIPTION OF THE PREFERRED EMBODIMENTS

Hereinafter, several preferred embodiments constructed according to the invention will be described in detail with reference to the accompanying drawings.

Figure 3:
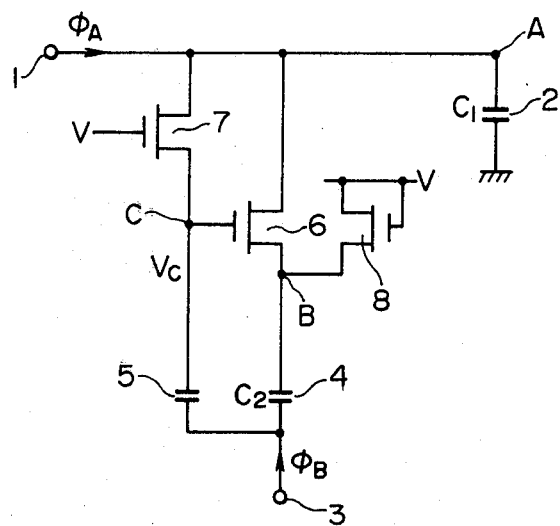
FIG. 3 is a circuit diagram of a preferred embodiment of a booster circuit according to the present invention.

In FIG. 3, which shows a first preferred embodiment of a booster circuit of the present invention, reference numeral 5 designates a boost capacitor associated with a node C, reference numerals 6 and 7 MOS transistors for separating a signal $\phi_A$ to be boosted and a boost capacitor 4 during driving periods in accordance with the level of the signal $\phi_A$, and reference numeral 8 a MOS transistor for charging the boost capacitor 4. The remaining circuit elements that are common to those shown in FIG. 1 bear the same reference numerals.

The operation of the booster circuit shown in FIG. 3 will be described with the assumption that the MOS transistors 6, 7 and 8 are of the N-channel type. Generally, an N-channel MOS transistor is rendered conductive when a positive voltage signal not lower than a threshold level voltage $V_T$ is applied to the gate thereof and the transistor is rendered non-conductive when the gate voltage is less than the threshold voltage $V_T$.

Figure 4A:
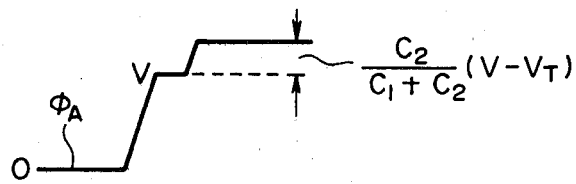
FIGS. 4A through 4C are explanatory diagrams each showing a signal waveform for describing the operation of the circuit shown in FIG. 3.
Figure 4B:
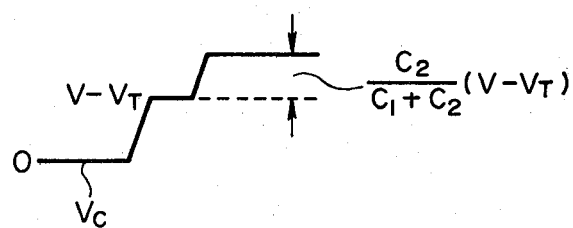
Figure 4C:
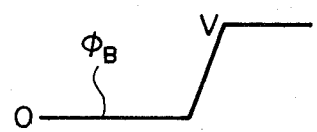

Referring now to FIGS. 4A to 4C, when a signal $\phi_A$ to be boosted as shown in FIG. 4A is at a low level, the gate voltage of the transistor is low. Accordingly, the transistor 6 is in the OFF state. As a result, a voltage $V - V_T$ appears at a node B provided through the transistor 8. With the load capacitor 2 charged by the signal $\phi_A$, the voltage appearing at the source of the transistor 6, that is, at the node B, is $V - V_T$ and therefore the transistor is in the OFF state. Consequently, the load capacitor 2 acts as the load for the signal $\phi_A$. If the level of the signal $\phi_A$ is completely raised to the level of V whereafter the level of the signal $\phi_B$ is raised as shown in FIG. 4C, the voltage level $V - V_T$ at the node C as shown in FIG. 4B is boosted up to a level not lower than the voltage level of $V + V_T$ through the boost capacitor 5 as a result of which the transistor 6 is turned on thereby applying the signal $\phi_A$ to the capacitor 4.

Thus, the signal $\phi_A$ is boosted in accordance with the signal $\phi_B$ through the boost capacitor 4.

Figure 5:
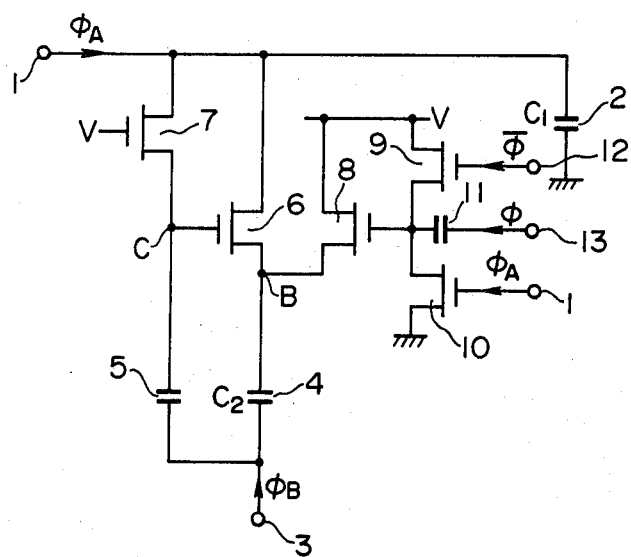
FIG. 5 is a circuit diagram showing another preferred embodiment of a booster circuit of the invention.

While the description above relating to the preferred embodiment shown in FIG. 3 assumes that the voltage appearing at the node B is maintained at $V-V_T$, the voltage may be raised up to the voltage level of V by the circuit shown in FIG. 5. In FIG. 5, reference numeral 9 designates a MOS transistor for raising the gate of the transistor 8 for a predetermined period of time, reference numeral 10 a MOS transistor for grounding the gate of the MOS transistor 8 immediately prior to boosting, referance numeral 11 a capacitor for increasing the gate voltage of the MOS transistor 8 to a level not lower than $V+V_T$ to thereby boost the voltage level appearing at the node B to a power source voltage level V upon the initiation of a boost operation with the capacitor 4, reference numeral 12 an input terminal to which a signal $\overline{\phi}$ is applied, and reference numeral 13 an input terminal to which a signal $\phi$ is applied.

Figure 6A:
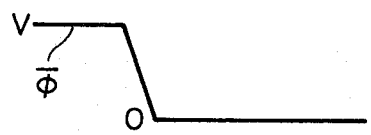
FIGS. 6A through 6D are explanatory diagrams each showing a signal waveform for describing the operation of the circuit shown in FIG. 5.
Figure 6B:
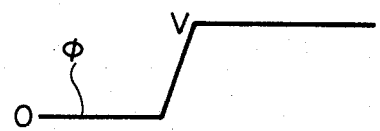
Figure 6C:
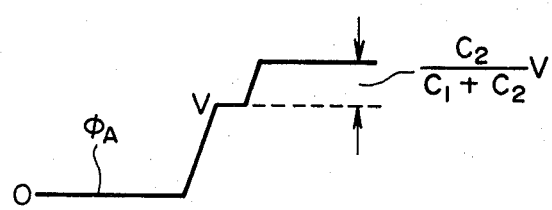
Figure 6D:
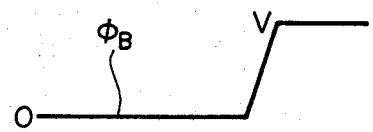

The booster circuit shown in FIG. 5 operates in the following manner. When the signal $\phi_A$ is at a low level as shown in FIG. 6C, the gate voltage of the transistor 6 is at a low level. Accordingly, the transistor 6 is in the OFF state. As a result, the gate voltage of the transistor 8 is set to the level of $V-V_T$ by the signal $\overline{\phi}$ shown in FIG. 6A. Subsequently, when the signal $\phi$ changes from the low level to the high level as shown in FIG. 6B, the gate voltage of the transistor 8 is boosted to a voltage level not lower than $V+V_T$ through the capacitor 11 whereby the voltage appearing at the node B becomes V. Then, when the signal $\phi_A$ changes from the low level to the high level thereby charging the load capacitor 2, the source voltage of the transistor 6, that is, the voltage appearing at the node B, is V and thus the transistor 6 is set to the OFF state. Therefore, the load capacitor 2 acts as the load for the signal $\phi_A$. On the other hand, in this case, the gate voltage of the transistor 8 is grounded through the transistor 10 due to the level of the signal $\phi_A$. As a result, the transistor 8 is rendered non-conductive. Next, when the signal $\phi_B$ is raised from the low level to the high level as shown in FIG. 6D, the voltage level at the node C, which is maintained at $V-V_T$, is boosted to a level not lower than $V+V_T$ through the boost capacitor 5 as a result of which the transistor 6 is rendered conductive to thereby couple the signal $\phi_4$ to the boost capacitor 4. In this case, the signal $\phi_A$ is boosted simultaneously through the boost capacitor 4 by the signal $\phi_B$.

Figure 7:
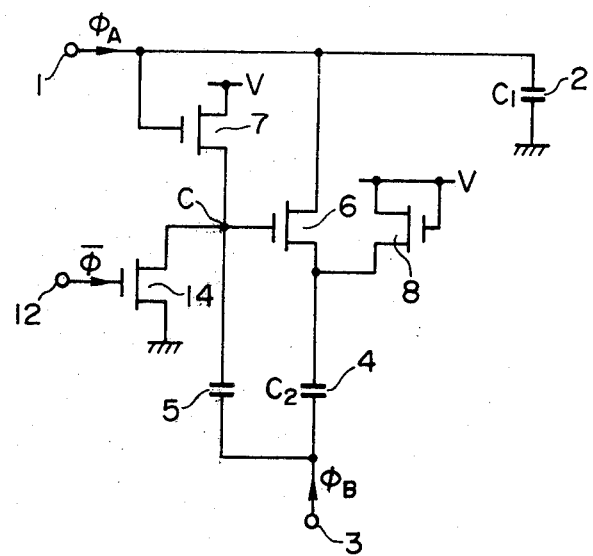
Figure 8A:
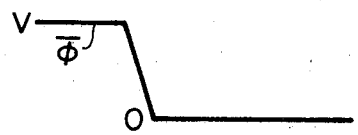
Figure 8B:
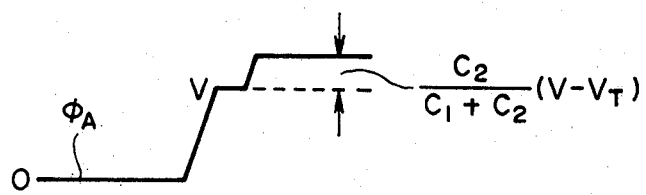
Figure 8C:

FIG. 7 is a circuit diagram showing a still another embodiment of the invention in which reference numeral 14 designates an MOS transistor for holding the gate voltage level of the transistor 6 at ground when no boosting is required. The booster circuit shown in FIG. 7 operates as follows. When the signal $\phi_A$ is at a low level as shown in FIG. 8B, the gate of the transistor 6 is grounded through the transistor 14 as the signal $\overline{\phi}$ is at a high level and thus the transistor 6 is set to the OFF state. Subsequently, when the signal $\phi_A$ changes from the low level to the high level after the signal $\overline{\phi}$ has changed to a low level, the gate of the transistor 6 is raised to the level of $V-V_T$ through the transistor 7 upon application of the signal $\phi_A$. Since the source of the transistor 6 is set to the voltage level of $V-V_T$ by the transistor 8, the transistor 6 is set to the OFF state. Accordingly, the load of the signal $\phi$, is only the load capacitor 2. After the signal $\phi_A$ has risen completely to the level of V, when the signal $\phi_B$ rises as shown in FIG. 8C, the voltage level at the node C is boosted from $V-V_T$ to a level not lower than $V+V_T$. As a result, the transistor 6 is rendered conductive thereby coupling the signal $\phi_A$ to the boost capacitor 4. In this manner, the signal $\phi_A$ is boosted through the boost capacitor in accordance with the signal $\phi_B$.

Figure 1:
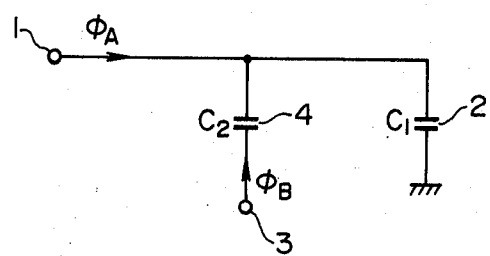
FIG. 1 is a circuit diagram showing a conventional booster circuit.
Figure 2A:
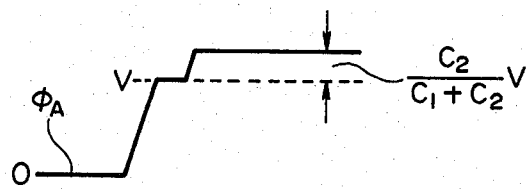
FIG. 2A and FIG. 2B are explanatory diagrams showing signal waveforms for the purpose of describing the operation of the circuit shown in FIG. 1.
Figure 2B:
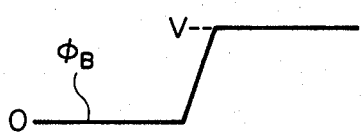
Figure 9:
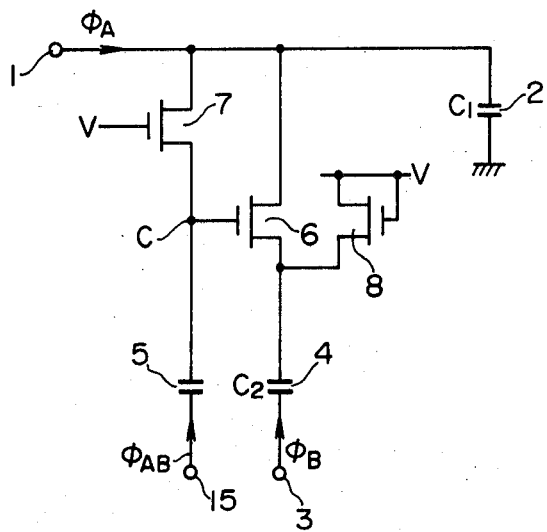
Figure 10A:
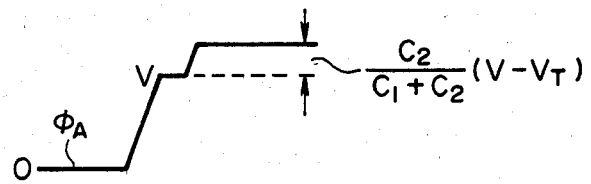

FIG. 9 is a circuit diagram showing a still further embodiment of the present invention in which the circuit elements that are common to those previously shown in FIGS. 1, 3 and 5 bear the same reference numerals. In FIG. 9, reference numeral 15 designates an input terminal of a boosting signal $\phi_{AB}$ which has an earlier rise time than the signal $\phi_B$. In this circuit, when the signal $\phi_A$ is at a low level as shown in FIG. 10A, the gate voltage of the transistor 6 is also at a low level. Accordingly, the transistor 6 is set to the OFF state and the source of the transistor 6 is set to the voltage level $V-V_T$ by the operation of the transistor 8.

Figure 10B:
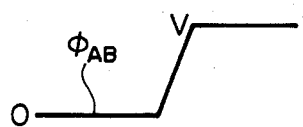
Figure 10C:
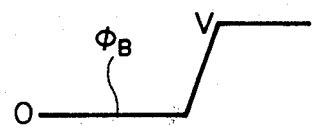

When the signal $\phi_A$ charges the load capacitor 2, since the source voltage of the transistor 6 is $V-V_T$, the transistor 6 is set to the OFF state. Therefore, the voltage level of the load for the signal $\phi_A$ has risen completely V. When the signal $\phi_{AB}$ rises as shown in FIG. 10B, the voltage level of $V-V_T$ at the node C is boosted to a voltage level not lower than $V+V_T$ through the boost capacitor 5. As a result, the transistor 6 is rendered conductive to thereby couple the signal $\phi_A$ to the boost capacitor 4. Subsequently, when the signal $\phi_B$ rises as shown in FIG. 10C, the signal $\phi_A$ is boosted through the boost capacitor 4 upon application of the signal $\phi_B$.

FIG. 11 is a circuit diagram of a yet further preferred embodiment of the invention in which reference numerals 15 and 16 designate MOS transistors and 17 designates a boost capacitor for charging, discharging and boosting the voltage at the node D. Signals $\overline{\phi}_C$, $\phi_D$ and $\phi_E$ are applied to the gate of the MOS transistor 10, the boost capacitor 17 and the gate of the MOS transistor 15, respectively.

Referring now to FIGS. 12A through 12F, the operation of the circuit shown in FIG. 11 will be described. When the signal $\phi_A$ to be boosted is at a low level, the gate voltage of the transistor 6 is also at a low level. Accordingly, the transistor 6 is rendered non-conductive and therefore the node B is set to $V-V_T$ by operation of the transistor 8. When the signal $\phi_A$ charges the load capacitor 2, since the source voltage of the transistor 6, that is, the voltage level at the node B is $V-V_T$, the transistor 6 is set to the OFF state. Consequently, the load for the signal $\phi_A$ is only the load capacitor 2. When the voltage at the node C is set through the transistor 16 to $V-V_T$, upon the application of the signal $\phi_D$, the voltage level is boosted to approximately $2V-V_T$. Therefore, when the signal $\phi_A$ is applied to the input terminal 1, the node C is set to the level of V through the transistor 7. Subsequently, the node D is set to 0 V or ground by application of the signal $\phi_E$. In this case, the node C is maintained at the level of V. When the signal $\phi_B$ is applied, the voltage at the node C is boosted by the boost capacitor 5 so that the voltage level thereof becomes not lower than the level of V. As a result, the transistor 6 is rendered conductive thereby coupling the siganal $\phi_A$ to the boost capacitor 4. Simultaneously, the signal $\phi_A$ is boosted through the boost capacitor 4 as controlled by the signal $\phi_B$. When the gate of the transistor 7 is coupled to the V source, a voltage of $V-V_T$ appears at the node C initially. However, when the node D is set to a voltage level not lower than V by operation of the transistor 10, the boost capacitor 11 and the signal $\phi_C$ and hence setting the node C to V before boosting, rapid boosting is achieved.

As is clear from the above description, according to the invention, because the boost capacitor is electrically coupled to the signal to be boosted only when boosting is actually carried out, the load upon the signal to be boosted is reduced. As a result, minimization of the circuit size needed for generating the signal to be boosted and reduction of driving power consumption are attained.

What is claimed is:

1. A booster circuit comprising: a load capacitor coupled to a terminal to which a signal to be boosted is applied; a boost capacitor to which a boosting signal is applied; and means for coupling said signal to be boosted to said boost capacitor only during boosting periods for said signal to be boosted.

2. The booster circuit as defined in claim 1 further comprising means for charging said boost capacitor to a predetermined voltage level before said boosting periods.

3. The booster circuit as defined in claim 1 or 2 wherein said coupling means comprises an insulated gate FET for coupling said signal to be boosted to said boost capacitor.

4. A booster circuit comprising: a load capacitor coupled to be driven by a signal to be boosted; a first FET transistor having a first signal electrode coupled to receive said signal to be boosted and a gate electrode coupled to an external voltage source; a second FET transistor having a first signal electrode coupled to receive said signal to be boosted and having a gate electrode coupled to a signal electrode of said first FET transistor; a first boost capacitor coupled between said second signal electrode of said first FET transistor and a source of a boosting signal; a second boost capacitor coupled between a second signal electrode of said second FET transistor and said source of said boosting signal; and a third FET transistor having a first signal electrode coupled to said second signal electrode of said second FET transistor and a second signal electrode and gate electrode coupled to said external voltage source.

5. A booster circuit comprising: a load capacitor coupled to be driven by a signal to be boosted; a first FET transistor having a first signal electrode coupled to receive said signal to be boosted and a gate electrode coupled to an external voltage source; a second FET transistor having a first signal electrode coupled to receive said signal to be boosted and having a gate electrode coupled to a signal electrode of said first FET transistor; a first boost capacitor coupled between said second signal electrode of said first FET transistor and a source of a boosting signal; a second boost capacitor coupled between a second signal electrode of said second FET transistor and said source of said boosting signal; a third FET transistor having a first signal electrode coupled to said second signal electrode of said second FET transistor and a second signal electrode coupled to said external voltage source; a fourth FET transistor having a first signal electrode coupled to said external voltage source and a second signal electrode coupled to a gate electrode of said third FET transistor; a fifth FET transistor having a first signal electrode coupled to said gate electrode of said third FET transistor and a second signal electrode coupled to ground; and a capacitor having a first terminal coupled to said gate electrode of said third FET transistor, said signal to be boosted being coupled to a gate electrode of said fifth FET transistor, a control signal being coupled to a second electrode of said capacitor and said control signal inverted being coupled to a gate electrode of said fourth FET transistor.

6. A booster circuit comprising: a load capacitor coupled to be driven by a signal to be boosted; a first FET transistor having a gate electrode coupled to receive said signal to be boosted and a first signal electrode coupled to an external voltage source; a second FET transistor having a first signal electrode coupled to receive said signal to be boosted and a gate electrode coupled to a second signal electrode of said first FET transistor; a first boost capacitor coupled between said second signal electrode of said first FET transistor and a source of a boosting signal; a second boost capacitor coupled between a second signal electrode of said second FET transistor and said source of said boosting voltage; a third FET transistor having a first signal electrode coupled to said gate of said second FET transistor, a second signal electrode coupled to ground and a gate electrode coupled to a source of a control signal; and a fourth FET transistor having a first signal electrode coupled to said second signal electrode of said second FET transistor and a second signal electrode and a gate electrode coupled to said external voltage source.

7. A booster circuit comprising: a load capacitor coupled to be driven by a signal to be boosted; a first FET transistor having a first signal electrode coupled to receive said signal to be boosted and a gate electrode coupled to an external voltage source; a second FET transistor having a first signal electrode coupled to receive said signal to be boosted and a gate electrode coupled to a second signal electrode of said first FET transistor; a first boost capacitor coupled between said second signal electrode of said first FET transistor and a source of a first boosting signal; a second boost capacitor coupled between said second signal electrode of said second FET transistor and a second source of a boosting signal, the rise of said second boosting signal occurring later in time than the rise of said first boosting signal; and a third FET transistor having a first signal electrode coupled to said second signal electrode of said second FET transistor and a second signal electrode and gate electrode coupled to said voltage source.

8. A booster circuit comprising: a load capacitor coupled to be driven by a signal to be boosted; a first FET transistor having a first signal electrode coupled to receive said signal to be boosted; a second FET transistor having a first signal electrode coupled to receive said signal to be boosted and a gate electrode coupled to a second signal electrode of said first FET transistor; a first boost capacitor coupled between said second signal electrode of said first FET transistor and a source of a boosting signal; a second boost capacitor coupled between a second signal electrode of said second FET transistor and said source of a boosting signal; a third FET transistor having a first signal electrode coupled between said second signal electrode of said second FET transistor and a second signal electrode and a gate electrode coupled to an external voltage source; a fourth FET transistor having a first signal electrode coupled to a gate electrode of said first FET transistor and a second signal electrode coupled to said external voltage source; a fifth FET transistor having a first signal electrode coupled to said gate electrode of said first FET transistor and a second signal electrode coupled to ground; a capacitor coupled between a first control signal source and said gate electrode of said first FET transistor, a gate electrode of said fourth FET transistor being coupled to a second control signal source and a gate electrode of said fifth FET transistor being coupled to a third control signal source.

9. A booster circuit comprising: a load capacitor coupled to a terminal to which a signal to be boosted is coupled; a first boost capacitor having a first terminal to which a boosting signal is applied; means for coupling said signal to be boosted to said first boost capacitor only during boosting periods for said signal to be boosted and; a second boost capacitor having a first terminal to which said boosting signal is applied and a second terminal connected to a control element of said coupling means for driving said coupling means.

10. A booster circuit comprising:
a load capacitor coupled to a terminal to which a signal to be boosted is coupled; a first boost capacitor having a first terminal to which first boosting signal is applied; means for coupling said signal to be boosted to said first boost capacitor only during boosting periods for said signal to be boosted; and a second boost capacitor having a first terminal to which a second boosting signal different from said first boosting signal is applied and a second terminal connected to a control element of said coupling means for driving said coupling means.

* * * * *